United States Patent
Inamori et al.

(10) Patent No.: US 6,392,444 B1
(45) Date of Patent: May 21, 2002

(54) IIL RESET CIRCUIT

(75) Inventors: Masanori Inamori; Hiroki Doi, both of Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/546,660

(22) Filed: Apr. 10, 2000

(30) Foreign Application Priority Data

Apr. 28, 1999 (JP) .......................... 11-121760

(51) Int. Cl.[7] .......................... H03L 7/00; H03K 19/091
(52) U.S. Cl. .................. 326/100; 327/143; 327/198
(58) Field of Search .................. 326/100, 79; 327/143, 327/198

(56) References Cited

U.S. PATENT DOCUMENTS 4,268,763 A * 5/1981 Johnson ............... 327/143
4,277,754 A * 7/1981 Minakuchi ............ 327/12

FOREIGN PATENT DOCUMENTS

| JP | 59066226 A | * 4/1984 | ............ 326/100 |
| JP | 61208921 | 9/1986 | |
| JP | 62015919 A | * 1/1987 | ............ 327/143 |

* cited by examiner

Primary Examiner—Michael Tokar
Assistant Examiner—Daniel D. Chang

(57) ABSTRACT

An IIL reset circuit includes an IIL inverter having input and output terminals, and a capacitor connected to the IIL inverter through the input terminal. When the IIL inverter is supplied with a constant current, it charges the capacitor through the input terminal, and outputs a reset pulse through the output terminal. The reset pulse has a pulse width that is determined based on both a current supplied to the capacitor, and on a capacitance of the capacitor.

14 Claims, 4 Drawing Sheets

US 6,392,444 B1

IIL RESET CIRCUIT

CROSS-REFERENCES TO RELATED APPLICATIONS

This application is related to Japanese Patent Application No. HEI 11(1999)-121760, filed on Apr. 28, 1999 whose priority is claimed under 35 USC §119, the disclosure of which is incorporated by reference in its entirety.

BACKGROUND OF THE INVENTION

1. Field of the Invention

The present invention relates to an integrated injection logic (IIL) reset circuit which is used for stably maintaining an initial state of electronic devices immediately after power-up, so as to ensure a reliable initial operation.

2. Description of Related Art

A conventional reset circuit has a construction as shown in FIG. 5. In FIG. 5, when a voltage Vcc is applied to the reset circuit from a power source via a switch S, electric current runs to a capacitor C5 via a resistor 503 and charges the capacitor C5. Thereby a base voltage of a transistor 502 begins to increase. When the base voltage exceeds a threshold voltage, the transistor 502 is turned on. That is, even if the voltage Vcc is applied, in an initial state, the transistor 502 is in a off state and an output of an inverter 501 is conductive, i.e., in a "Low" state and a flip-flop circuit 506 is in a reset state. After the voltage Vcc is applied, the base voltage of the transistor 502 is raised by a charge accumulated in the capacitor C5. When the base voltage exceeds a threshold voltage of the transistor 502, the transistor 502 is turned on and the output of the inverter 501 is changed to a cut-off state, i.e., a "High" state. Thereby the flip-flop circuit 506 is released from the reset state and goes into a standby state. Thus a reset period is determined by a time period during which the voltage of the capacitor C5 exceeds to the threshold voltage. Accordingly, if the reset period is set sufficiently longer than a time period necessary for the flip-flop circuit 506 to begin operation, the initial state can be maintained stably after the switch S is turned on.

Another conventional reset circuit is shown in FIG. 6 (see Japanese Unexamined Patent Publication No. SHO 61(1986)-208921, for example). In FIG. 6, in addition to a basic construction in which an output of an inverter 607 is connected to a flip-flop circuit 614, resistors 608, 609 and 612 and transistors 604 and 605 are added. With this construction, a threshold voltage level at which a reset cancellation signal is output is set with respect to a value into which a supply voltage Vcc is divided by the resistors 608, 609 and 612. A reset pulse is generated using a time period required for rise of a power source. Thus, a capacitor is not required at all in this arrangement, and the above reset circuit is formed within a single integrated circuit.

However, these conventional reset circuits have the following drawbacks.

In the reset circuit shown in FIG. 5, the reset pulse may be disturbed by a noise generated outside or inside the circuit and comparable to the threshold voltage for setting the reset or canceling the reset. Furthermore, since the capacitor C5 is required to have a large capacitance, the capacitor C5 must be provided outside the circuit as an attached component. Accordingly, the reset circuit is susceptible to an external noise through external terminals for connecting the capacitor. Also, since resistance exists between grounds of the integrated circuit and the externally attached component and a difference is produced between potential levels of the grounds through operation of the circuit or by an external noise, a wrong reset pulse may be generated. Furthermore, if the rise of the supply voltage at power-up is extremely slow, the charging of the capacitor is completed before reaching an operating voltage of the flip-flop circuit, so that the reset pulse is not generated.

In the reset circuit shown in FIG. 6, the rise time of the power source is utilized for determining the reset time. If the supply voltage reaches an operating voltage within an extremely short period at the power-up, the transistor 605 is saturated in a moment, and the reset state is cancelled before a reset pulse is output. Thus, an effective reset pulse is not generated sufficiently.

SUMMARY OF THE INVENTION

The present invention provides a IIL reset circuit comprising an IIL inverter having input and output terminals, and a capacitor connected to the IIL inverter through the input terminal, wherein the IIL inverter, when supplied with a constant current to be activated, charges the capacitor through the input terminal and outputs a reset pulse through the output terminal, the reset pulse having a pulse width determined based on a current supplied to the capacitor and a capacitance of the capacitor.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
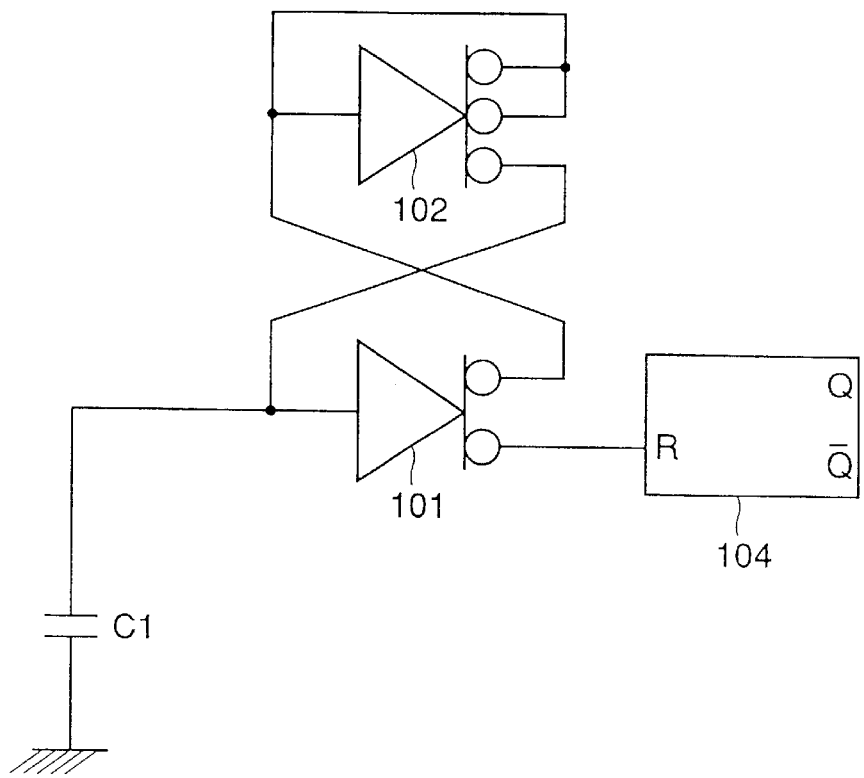
FIG. 1 is a logic circuit diagram of an IIL reset circuit in accordance with the present invention.

An reset circuit of the present invention includes an IIL circuit activated by a constant-current (injector current) source and a capacitor charged through the IIL circuit. Thereby, the following features can be realized;

(1) the reset pulse can be generated without depending on the rise time of the supply voltage;

(2) a capacitance and a size of the capacitor can be decreased by reducing a charging current to the capacitor in an initial state until the reset state is cancelled so that the reset circuit including the capacitor is constructed within a single integral circuit;

(3) a ground of the capacitor and that of the IIL circuit can be connected in a close vicinity within an integrated circuit so that the resistance between the grounds is reduced and the effect of an external noise is reduced; and (4) the reset circuit can perform a Schmitt current action at the cancellation of the reset state (the charging current to the capacitor is small before the reset state is cancelled but large after the reset state is cancelled) so that the reset circuit generates a stable reset pulse.

The IIL inverter may include pnp and npn transistors, each transistor having a collector, an emitter and a base, the collector of the pnp transistor being connected to the base of the npn transistor, the base and collector of the npn transistor constituting the input and output terminals, respectively.

The reset circuit of the present invention may further be provided with an adjusting circuit for adjusting the current to be supplied to the capacitor. Preferably, the adjusting circuit decreases the current to be supplied to the capacitor while the IIL inverter outputs a reset pulse and increases the current to be supplied to the capacitor when the IIL inverter finishes the reset pulse. Thereby it is possible to adjust the charging current to the capacitor to a minimum and also to increase the charging current after the reset is cancelled.

Preferably, the present invention is so constructed that the IIL inverter includes a first IIL inverter having an input terminal and two output terminals and the adjusting circuit includes a second IIL inverter having an input terminal and a plurality of output terminals, one of the output terminals of the first IIL inverter being connected to the input terminal of the second IIL inverter, a part of the plurality of output terminals of the second IIL inverter being connected to the input terminal of the first IIL inverter, the rest of the plurality of output terminals of the second IIL inverter being connected to the input terminal of the second inverter.

The present invention may also be so constructed that the second IIL inverter has (m+n) output terminals, n of the output terminals being connected to the input terminal of the first IIL inverter, the rest m of the output terminals being connected to the input terminal of the second IIL inverter, the current supplied to the capacitor being controlled by changing a ratio of n:m.

Inverters Used for IIL Reset Circuits

Figure 4:
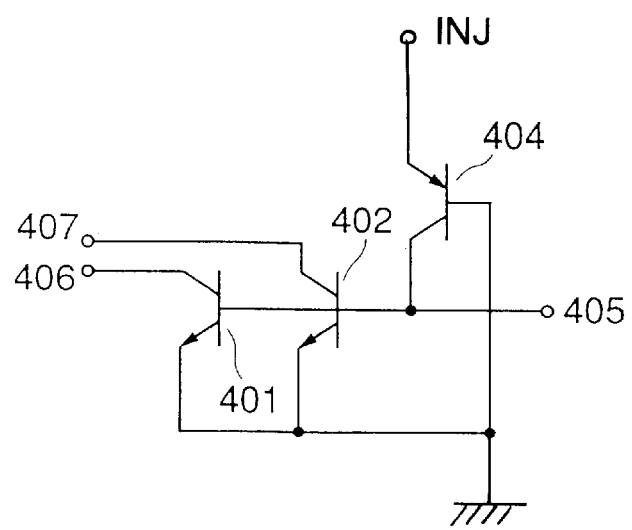
FIG. 4 is a diagram illustrating the construction of a circuit of a general IIL inverter.
Figure 5:
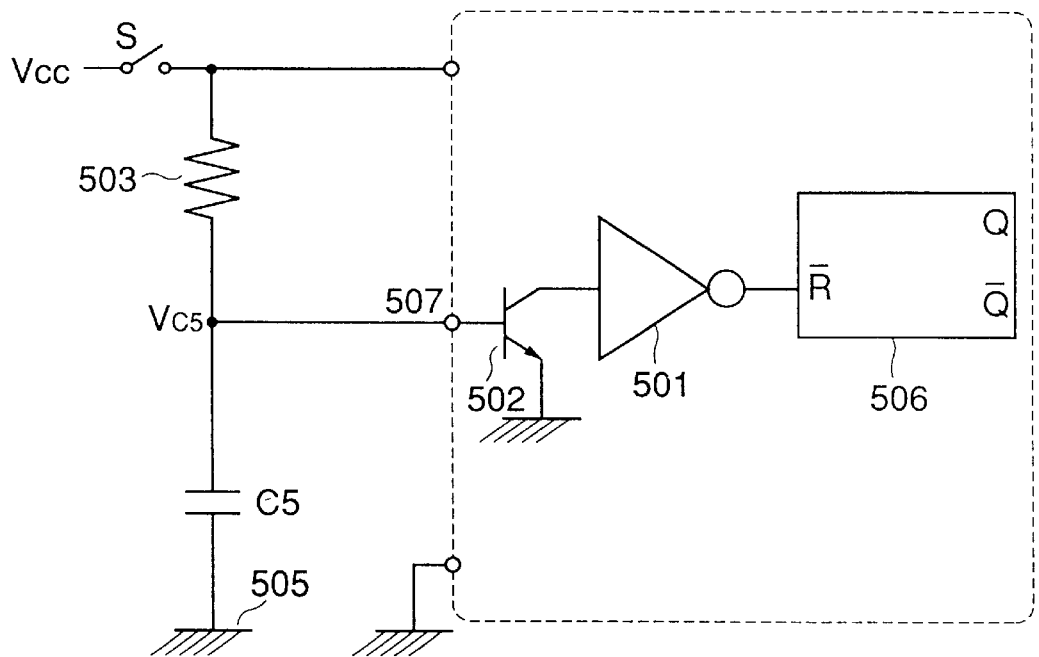
FIG. 5 is a circuit diagram illustrating a conventional IIL reset circuit.
Figure 6:
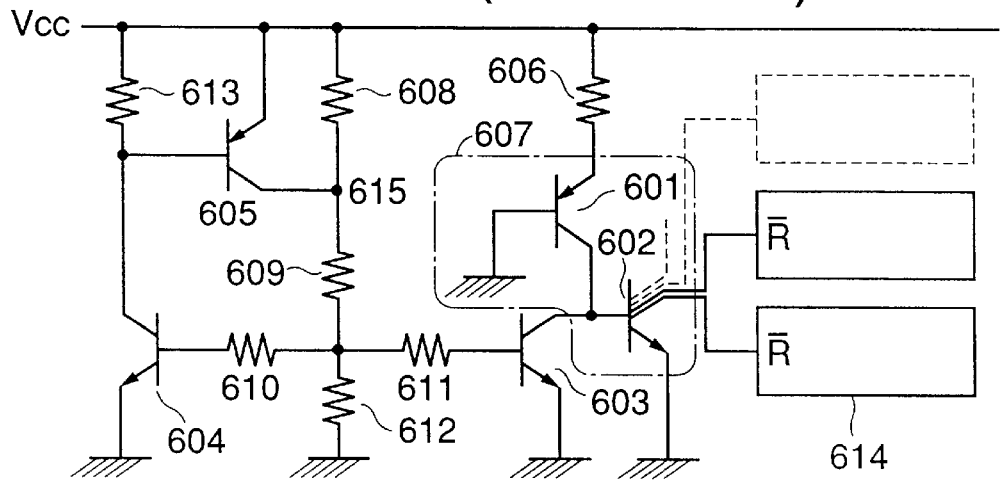
FIG. 6 is a circuit diagram illustrating another conventional reset circuit.

FIG. 4 shows a basic construction of an IIL inverter used in the present invention, that is, an example of a transistor construction of an IIL inverter circuit. This inverter is comprised of a combination of an injector transistor (pnp transistors) 404 and IIL transistors (npn transistor) 401 and 402. The injector transistor 404 has a base connected to the ground, and an injector current (constant current) is injected into its emitter through an injection terminal INJ. A collector of the injector transistor 404 and bases of the IIL transistors 401 and 402 are connected to an input terminal 405. Collectors of the IIL transistors 401 and 402 are connected to output terminals 406 and 407, respectively.

The injector current running through the emitter and collector of the injector transistor 404 is supplied to the bases of the IIL transistors 401 and 402.

When a voltage input to the input terminal 405 is "Low", the injector current flows to the input terminal so that the IIL transistors 401 and 402 is turned off, that is, the output terminals 406 and 407 are "High". On the other hand, when the voltage input to the input terminal 405 is "High", the injector current flows to the bases of the transistors 401 and 402, the outputs of the IIL transistors 401 and 402 is turned on, and the output terminals 406, 407 are "Low". In other words, a function of the inverter is realized by a High output (cut-off state) at a Low input and a Low output (conducing state) at a High input.

In the inverter shown in FIG. 4, the terminals 406 and 407 are used as output terminals. However, it is easy to construct an inverter having a plurality of output terminals by combining a plurality of IIL transistors to the inverter.

Moreover, by combination of a plurality of IIL inverters, a current mirror circuit is constructed in the following way.

Figure 7:
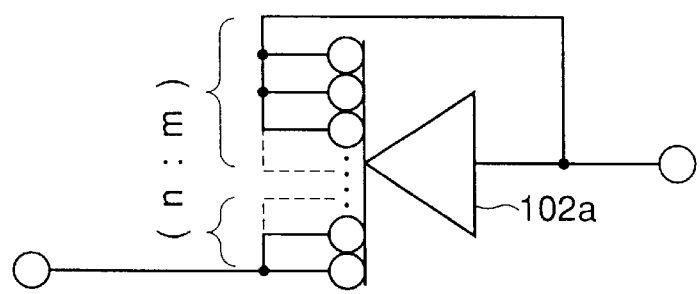
FIG. 7 is a logic circuit diagram of a current mirror of an IIL reset circuit in accordance with the present invention.

FIG. 7 shows an inverter 102a whose plural output terminals are partially connected to an input terminal of the inverter itself. The inverter 102a is used as another inverter in the present invention.

Figure 8:
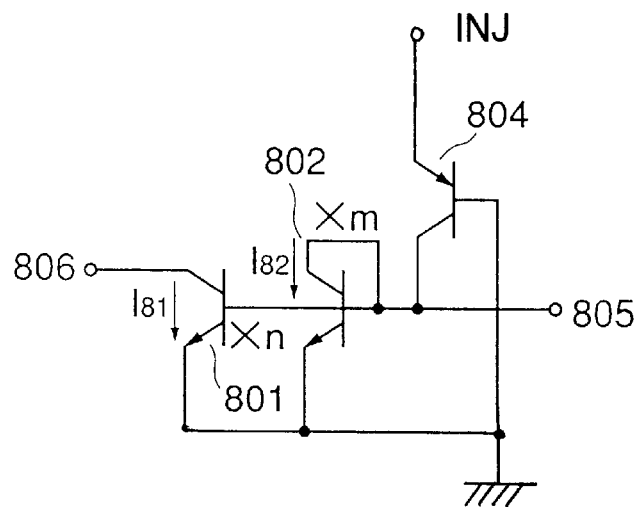
FIG. 8 is a circuit diagram of a current mirror of an IIL reset circuit in accordance with the present invention.

If this inverter is constructed of an ILL circuit, it is constructed as shown in FIG. 8. In FIG. 8, since a base and a collector of an IIL transistor 802 and a collector of an injector transistor 804 are connected to each other, a current $I_{82}$ flowing through the collector to emitter of the transistor 802 has the same amount as an injector current injected from a injector terminal INJ. Further, since the base of the IIL transistor 802 is connected to a base of an IIL transistor 801, a current $I_{81}$ flowing through the collector to emitter of the transistor 801 is the same amount as the injector current if the IIL transistor 801 is equal to the IIL, transistor 802 in size. In this circuit construction, the current $I_{82}$ having the same amount as the injector current always runs through the IIL transistor 802. The current flowing through the collector and emitter of the IIL transistor 801 is determined on the basis of the current $I_{82}$. Accordingly, if a plurality of IIL transistors are added to an output side of the inverter, an equal current runs through each of the added IIL transistors so that the current $I_{81}$ may be optionally set. However, if the IIL transistors are different in size, currents corresponding to relative ratios of the sizes of the IIL transistors run through the IIL transistors.

Therefore, the current $I_8$ drawn through the output terminal 806 in FIG. 8 can be selected as follows:

$$I_{81}=I_{82} \times n/m,$$

wherein n/m is a ratio of transistor sizes (a ratio of the numbers of transistors if transistors of the same size are used), and $$I_{82}=I_{inj},$$

where $I_{inj}$ is an injector current

In other words, by connecting an inverter of this construction to a constant-current source, it is possible to produce different values of constant current without changing the constant-current source.

IIL Reset Circuits of the Present Invention

IIL reset circuits of the present invention are described in detail.

FIG. 1 is a logic circuit diagram illustrating a construction in accordance with the present invention.

FIG. 1 shows a reset circuit including inverters 101 and 102 for generating a reset pulse and a capacitor C1, and a flip-flop 104 as an IIL circuit element which requires the reset pulse. In FIG. 1, used as the flip-flop 104 is an element which is reset when its reset terminal R is "High". However, needless to say, if the IIL circuit element requiring the reset pulse is one which is reset when its reset terminal R is "Low", it can easily be handled by inserting an inverter between the reset terminal and the output of the reset circuit of the invention so as to invert logic.

Figure 2:
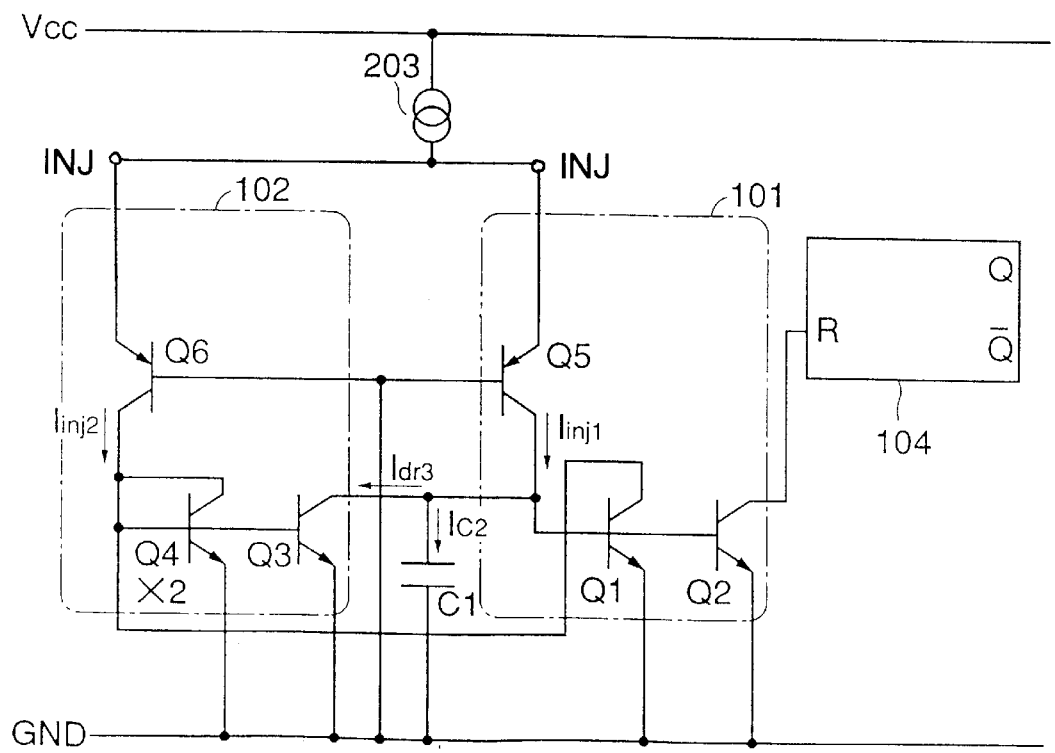
FIG. 2 is a circuit diagram of an IIL reset circuit in accordance with the present invention.

FIG. 2 illustrates the construction of the logic circuit of FIG. 1 as a combination of transistors. The reset circuit of the present invention is now explained with reference to FIG. 2.

The reset circuit is adapted to be activated based on an injector current. When the power source (Vcc) is turned on and a constant-current source 203 supplies an injector current to injection terminals INJ, the reset circuit and flip-flop 104 start to operate simultaneously. The flip-flop 104 falls in the reset state at the same time when it starts to operate. Of course, since the injector current is also used for a charging current to the capacitor C1 which determines the reset time, the charging of the capacitor C1 is started at the same time. A time period until the reset is cancelled (i.e., the width of the reset pulse) is determined by the charging time of the capacitor C1, and by the injector current supplied by the constant-current source 203. Thus, the width of the reset pulse is not dependent on a supply voltage Vcc.

An initial charging current $I_{C2}$ (during the reset time period) to the capacitor C1 is a current $I_{inj1}$ minus a current $I_{dr3}$ which is drawn through an IIL transistor Q3. The current $I_{dr3}$ can be optionally set by selecting the ratio of the sizes of the IIL transistors Q3 and Q4. Therefore, the current $I_{C2}$ supplied to the capacitor C1 can be optionally set, and it is possible to reduce a capacitance of the capacitor C1 and to incorporate the capacitor C1 in an integrated circuit with the inverters 101, 102.

Figure 3:
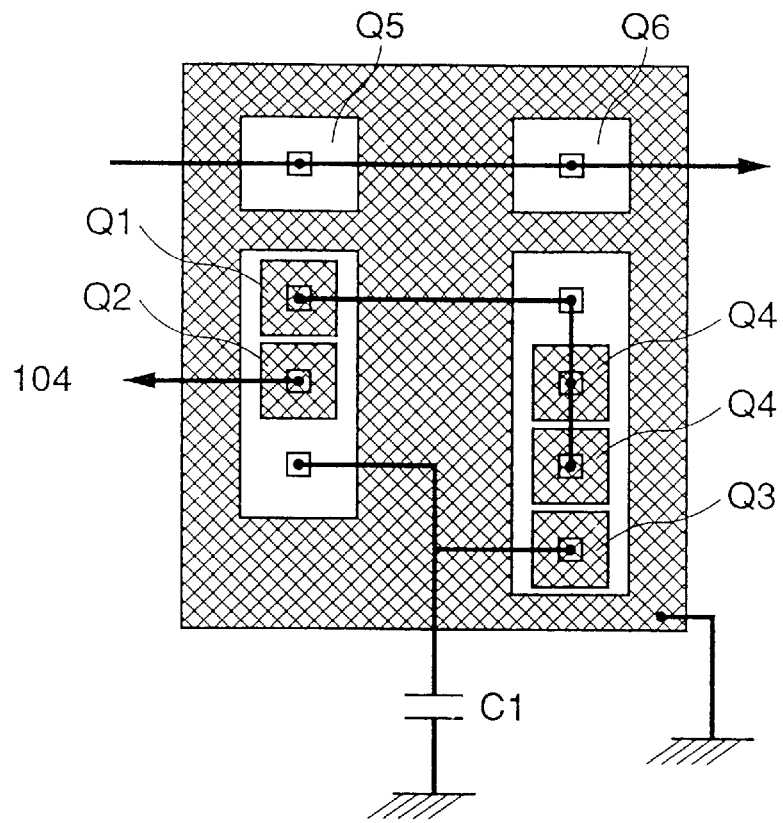
FIG. 3 is a schematic plan view of an IIL reset circuit in accordance with the present invention.

There are significant advantages in incorporating, within the circuit, the capacitor, which has conventionally been provided as an externally attached component. In the case where the capacitor is externally provided, there is a problem in that a difference is inevitably produced between potential levels of the grounds inside and outside the circuit due to the effect of wiring resistance and the like and therefore the ground potential levels are apt to change. However if the capacitor is incorporated within the reset circuit, the resistance between the grounds within the circuit is much reduced as compared with external connection, and the difference between the potential levels of grounds of components (transistors, capacitor, etc.) of the circuit become extremely small. Accordingly, the problem of the change of the ground potential levels is much solved. FIG. 3 is a schematic plan view illustrating a layout of the circuit shown in FIG. 2. Referring to FIG. 3, the capacitance of the capacitor is reduced as described above and the construction of the whole reset circuit is also simplified. Therefore a pattern of the reset circuit is easy to design and the reset circuit is suitable for being incorporated in an integrated circuit.

Further, in the reset circuit shown in FIG. 2, in which the capacitor C1 is charged up to the threshold level at a relatively low speed in an initial charging process (in the reset period) since the current $I_{dr3}$ is drawn by the IIL transistor Q3. Then, when a potential difference across the capacitor C1 reaches the threshold level, the output of the inverter 101 is turned to "Low", and both the IIL transistors Q3 and Q4 of the inverter 102 is turned off. Simultaneously, the current $I_{dr3}$ is not drawn by the IIL transistor Q3 any more, and the charging of the capacitor C1 is accelerated. Thus so-called "Schmitt current action" is realized. Thereby, the reset circuit, even if the capacitor C1 has a small capacitance, can ensure a sufficiently effective reset time (width of the reset pulse) and avoid an unstable operation in transition from the reset state to the cancellation of the reset. Further, also in a steady state after the cancellation of the reset, since the capacitor C1 is always charged stably with the injector current supplied by the constant-current source 203, a stable operation can be obtained.

Adjustment of Reset Period

In the reset circuit shown in FIG. 2, suppose that the inverter 102 does not exist, then the current $I_{C2}$ supplied to the capacitor C1 is the injector current $I_{inj1}$ supplied from the inverter 101. In the present invention, however, the inverter 102 is provided so that the current $I_{dr3}$ is drawn by the IIL transistor Q3 of the inverter 102. Therefore, the charging current $I_{C2}$ during the reset period is represented by the following formula:

$$I_{C2}=I_{inj1}-I_{dr3} \quad (1).$$

Figure 9:
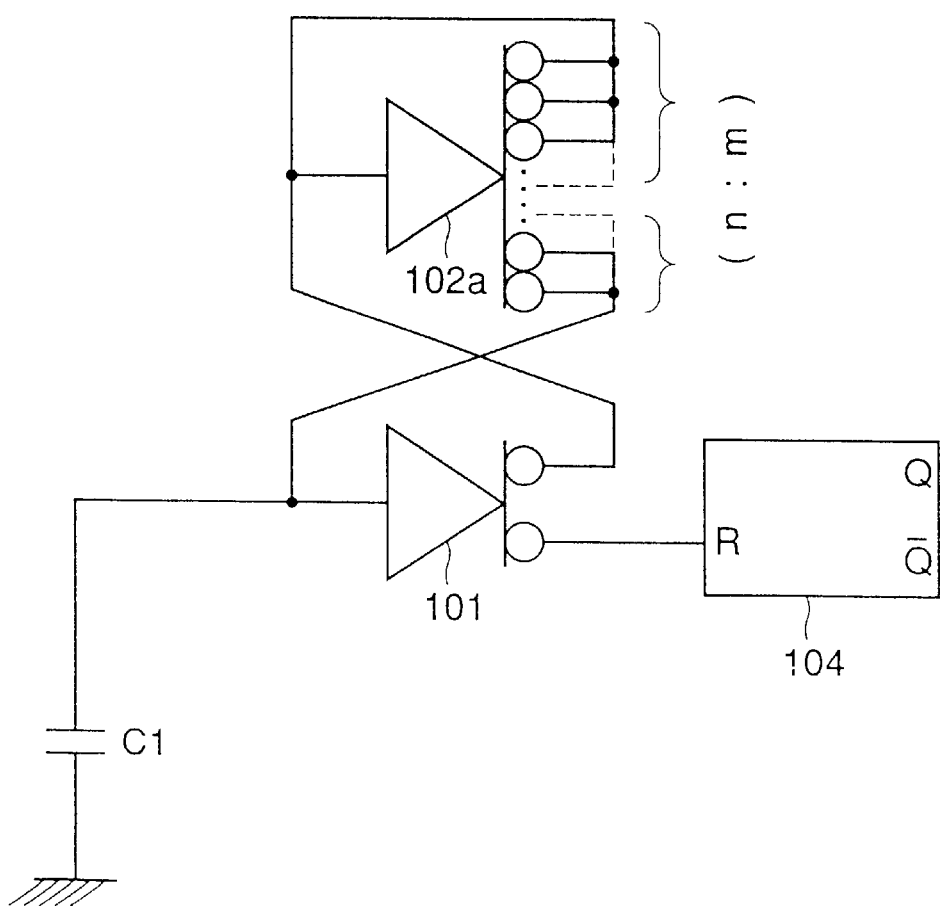
FIG. 9 is a logic circuit diagram illustrating another IIL reset circuit in accordance with the present invention.

Pay attention to the current $I_{dr3}$ running to the IIL transistor Q3. At present, the base and collector of the IIL transistor Q4 are connected to the base of the IIL transistor Q3 and the collector of the injector transistor Q6. The emitters of the IIL transistors Q3 and Q4 are both connected to the ground. The IIL transistors Q4 and Q3 form a current mirror circuit with respect to each other. A current having the same amount as the injector current $I_{inj2}$ runs through the collector and emitter of the IIL transistor Q4. The current $I_{dr3}$ is determined by the size ratio of the IIL transistors Q3 and Q4. If the size of the IIL transistor Q4 is n times larger than the size of the IIL transistor Q3 (two time in FIG. 2; FIG. 9 illustrates a logic circuit in which the sizes of transistors can be optionally selected for determining the drawn current $I_{dr3}$), the current $I_{dr3}$ is represented by the following formula:

$$I_{dr3}=I_{inj2}/n \quad (2)$$

where $I_{inj2}$ is an injector current of the inverter 102.

The injector currents $I_{inj1}$ and $I_{inj2}$ of the inverters 101 and 102 are equal if they are the same in size, since the injector transistor Q6 and injector transistor Q5 form a current mirror structure. Accordingly, the charging current $I_{C2}$ is represented by the following formula after all from the formulae (1) and (2):

$$I_{C2}=(1-1/n)\times I_{inj} \quad (3)$$

wherein $I_{inj}$ is the injector current ($=I_{inj1}=I_{inj2}$).

When the charging of the capacitor C1 by the charging current $I_{C2}$ proceeds and the voltage across the capacitor C1 exceeds the threshold level, the transistors Q1 and Q2 are turned on, the reset output of the transistor Q2 is turned to "Low" and the reset is cancelled. Also, because the bases of the IIL transistors Q3 and Q4 connected to the collector of the transistor Q1 is turned to "Low" (the inverter 202 falls into a cut-off state), the drawn current $I_{dr3}$ does not flow any more.

Therefore, when the charging of the capacitor C2 proceeds and then the voltage thereof exceeds the threshold level (the reset cancellation signal is output), the charging current $I_{C2}$ supplied to the capacitor C2 increases, which accelerates the charging of the capacitor C2. Therefore, unstable operation around the threshold level is significantly reduced. As understood from the formula (3), the charging current $I_{C2}$ in the initial state (during the reset period) is optionally selected by choosing the size ratio of the IIL transistors Q3 and Q4 (shown in FIG. 9). FIG. 9 shows another reset circuit in which the drawn current $I_{dr3}$ of FIG. 2 is changed. Here, the inverter 102 in FIG. 1 is replaced with an inverter 102a shown in FIG. 7.

On the other hand, the reset time t is determined by relationship between the capacitor C1 and the charging current $I_{C2}$ and is represented by the following formula:

$$t=c\times V_{th}/I_{C2} \quad (4)$$

where t is a reset time [sec] (width of the reset pulse or time necessary for the threshold level to be reached), c is a capacitance of the capacitor C1 [F] and $V_{th}$ is a threshold voltage [V] (for example, 0.7V).

As understood from the formula (4), since $I_{C2}$ is larger in conventional IIL circuits, the capacitance of the capacitor must be larger so that a sufficient reset time may be obtained.

For this reason, it has been impossible to incorporate the capacitor C1 within an integrated circuit. In the IIL reset circuit of the present invention, however, it is possible to set the charging current optionally, and therefore the capacitance c of the capacitor can be set smaller. Generally, if the capacitor has a smaller capacitance, operation around the threshold level is required to be considered carefully. However, according to the present invention, for the aforesaid reasons, unstable operation around the threshold level can be avoided even if the capacitance of the capacitor is small, and therefore, the capacitance of the capacitor is not limited. With such a reset circuit, the capacitor can be reduced in size and in addition to that it can be realized in a simplified structure as shown in FIG. 3. Thus the capacitor can be incorporated in an integrated circuit. Needless to say, IIL circuits which are reset by the above-described reset circuit are not limited to the flip-flop elements 104 as shown in FIG. 1 but the reset circuit can apply to all kinds of IIL elements that need initial resetting.

The present invention provides the following advantages: The reset circuit is composed only of IIL inverters and a capacitor, and the capacitor is charged with the injector current from the constant-current source. Therefore, the reset pulse is not dependent on the supply voltage and the timing of resetting is determined by the charging time of the capacitor. Thus the reset signal is surely obtained. In the IIL reset circuit of the present invention, since the charging current to the capacitor can be optionally set, the capacitance of the capacitor can be reduced. Therefore, it is easy to incorporate the capacitor in the circuit and it is possible to realize a simple pattern for the construction of the reset circuit itself. Therefore there is an economic advantage in that the degree of integration can be raised. Further, since the capacitor is realized within an integrated circuit, the resistance between the grounds of the IIL transistor and the capacitor can be reduced extremely low and an unstable potential difference between the grounds can be avoided. Also since unnecessary external terminals are eliminated, it is possible to avoid mis-operation caused by external noise which might be produced at such external terminals. Furthermore, the charging of the capacitor is accelerated just after the reset cancellation signal is output, stable operation after the cancellation of the reset is ensured, which improves the reliability of the circuit.

What is claimed is:

1. An IIL reset circuit comprising;

an IIL inverter having an input terminal and an output terminal, and a capacitor connected to the IIL inverter through the input terminal, wherein the IIL inverter, when supplied with a constant current to be activated, charges the capacitor through the input terminal and outputs a reset pulse through the output terminal, the reset pulse having a pulse width determined based on a current supplied to the capacitor and a capacitance of the capacitor, wherein the capacitor is the only capacitor in the reset circuit, and wherein the reset circuit does not contain any resistors.

2. The IIL reset circuit of claim 1, wherein the IIL inverter includes a pnp transistor and an npn transistor, each transistor having a collector, an emitter and a base, the collector of the pnp transistor being connected to the base of the npn transistor, the base and the collector of the npn transistor constituting the input terminal and the output terminal, respectively.

3. The IIL reset circuit of claim 1, further comprising an adjusting circuit for adjusting the current to be supplied to the capacitor.

4. The IIL reset circuit of claim 3, wherein the adjusting circuit decreases the current to be supplied to the capacitor while the IIL inverter outputs the reset pulse and increases the current to be supplied to the capacitor when the IIL inverter finishes the reset pulse.

5. The IIL reset circuit of claim 4, wherein said adjusting performed by the adjusting circuit provides the ability to keep adjustments of charge current to a minimum, and also to increase charge current after a reset is canceled.

6. The IIL, reset circuit of claim 3, wherein the IIL inverter includes a first IIL inverter having an input terminal and two output terminals and the adjusting circuit includes a second IIL inverter having an input terminal and a plurality of output terminals, one of the output terminals of the first IIL inverter being connected to the input terminal of the second IIL inverter, a part of the plurality of output terminals of the second IIL inverter being connected to the input terminal of the first IIL inverter, the rest of the plurality of output terminals of the second IIL inverter being connected to the input terminal of the second inverter.

7. The IIL reset circuit of claim 6, wherein the second IIL inverter has (m+n) output terminals, n of the output terminals being connected to the input terminal of the first IIL inverter, the rest m of the output terminals being connected to the input terminal of the second IIL inverter, the current to be supplied to the capacitor being controlled by changing a ratio of n:m.

8. The IIL reset circuit of claim 6, wherein the first and second IIL inverters and the capacitor are incorporated in an integrated circuit.

9. The IIL reset circuit of claim 3, wherein a time period until a reset is cancelled is not dependent on a supply voltage fed to the rest circuit.

10. The IIL reset circuit of claim 1, wherein the reset pulse is generated without depending on a rise time of a supply voltage fed to the reset circuit.

11. The IIL reset circuit of claim 1, wherein capacitance and size of the capacitor is decreased by reducing charging current to the capacitor in an initial state, until the reset state is cancelled, thereby providing a reset circuit that is constructed as a single integral circuit.

12. The IIL reset circuit of claim 1, wherein a ground of the capacitor and that of the IIL circuit is connected in close vicinity within an integrated circuit, so that any resistance between grounds is reduced and effects of any external noises are reduced.

13. The IIL reset circuit of claim 1, wherein at a cancellation of the reset state, charging current to the capacitor is maintained to be smaller before the reset state is cancelled, but larger after the reset state is cancelled, so that the reset circuit generates a stable reset pulse.

14. An IIL reset circuit comprising;

an IIL inverter having an input terminal and an output terminal, and a single capacitor connected to the IIL inverter through the input terminal, wherein the IIL inverter charges the single capacitor through the input terminal and outputs a reset pulse through the output terminal, and wherein the reset pulse is generated without depending on a rise time of any supply voltage fed to the reset circuit.

* * * * *